(12) United States Patent
Van Munster et al.

(10) Patent No.: US 8,858,715 B2
(45) Date of Patent: Oct. 14, 2014

(54) DEVICE FOR LAYERED DEPOSITION OF VARIOUS MATERIALS ON A SEMICONDUCTOR SUBSTRATE, AS WELL AS A LIFT PIN FOR USE IN SUCH A DEVICE

(75) Inventors: Marcus Gerardus Van Munster, Tilburg (NL); Charles Petronella Marie Buijs, Veldhoven (NL); Age Leijenaar, Arnhem (NL)

(73) Assignee: XYCarb Ceramics B.V., Helmond (NL)

( * ) Notice: Subject to any disclaimer, the term of this patent is extended or adjusted under 35 U.S.C. 154(b) by 1130 days.

(21) Appl. No.: 12/744,870

(22) PCT Filed: Sep. 19, 2008

(86) PCT No.: PCT/NL2008/000208
§ 371 (c)(1),
(2), (4) Date: Nov. 22, 2010

(87) PCT Pub. No.: WO2009/070006
PCT Pub. Date: Jun. 4, 2009

(65) Prior Publication Data
US 2011/0056436 A1 Mar. 10, 2011

(30) Foreign Application Priority Data

Nov. 30, 2007 (NL) .................................... 1034780

(51) Int. Cl.
*C23C 16/00* (2006.01)
*C23C 16/458* (2006.01)
*H01L 21/687* (2006.01)
*C23F 1/00* (2006.01)
*H01L 21/306* (2006.01)

(52) U.S. Cl.
CPC ...... *C23C 16/4581* (2013.01); *H01L 21/68742* (2013.01); *C23C 16/4586* (2013.01)

USPC .......... 118/729; 118/728; 118/730; 118/731; 118/732; 156/345.51; 156/345.52; 156/345.53; 156/345.54; 156/345.55

(58) Field of Classification Search
CPC ..................... H01L 21/68742; H01L 21/6831; H01L 21/67069; H01L 21/67103; H01L 21/67115; H01L 21/6833; H01L 21/67167; H01L 21/67178; H01L 21/6719; H01L 21/68721; H01L 21/6875; H01L 21/68757; H01L 21/02532; H01L 21/67109; H01L 21/68785; H01L 21/02104; H01L 21/02579; H01L 21/0262; H01L 21/67034; H01L 21/68735; H01L 21/68764; H01L 21/68771; C23C 16/4586; C23C 16/46; C23C 16/458; C23C 16/4583; C23C 16/45544; C23C 16/45546; C23C 16/4581; C23C 16/4585; C23C 16/50; C23C 16/44; C23C 16/4412; C23C 16/54; C23C 16/45521; C23C 16/4584; C23C 16/4401; C23C 16/463; C23C 16/507; C23C 16/401; C23C 16/4404; C23C 16/4405; C23C 16/4411; C23C 16/45502; C23C 16/45504; C23C 16/4551; C23C 16/45582; C23C 16/481; C23C 16/511
USPC ......... 118/715, 728–732; 156/345.51–345.55
See application file for complete search history.

(56) References Cited

U.S. PATENT DOCUMENTS

| | | | | |
|---|---|---|---|---|
| 5,807,416 A | * | 9/1998 | Kemmochi et al. | 65/32.4 |
| 5,916,370 A | * | 6/1999 | Chang | 118/729 |
| 6,596,086 B1 | * | 7/2003 | Honma et al. | 118/728 |
| 2003/0162462 A1 | | 8/2003 | Lee et al. | |
| 2003/0178145 A1 | * | 9/2003 | Anderson et al. | 156/345.51 |
| 2005/0183669 A1 | | 8/2005 | Parkhe et al. | |
| 2006/0113806 A1 | * | 6/2006 | Tsuji et al. | 294/1.1 |

FOREIGN PATENT DOCUMENTS

| | | | |
|---|---|---|---|
| EP | 0763504 A | | 3/1997 |
| KR | 2005077171 | * | 8/2005 |

OTHER PUBLICATIONS

International Search Report for International Application No. PCT/NL2008/000208 dated Dec. 22, 2008.

Database WPI Week 200668, Thomson Scientific, London, GB; AN 2006-653536, XP002486846, & KR 2005 077 171 A (Samsung Electronics Co., Ltd.), Aug. 1, 2005, abstract.

\* cited by examiner

*Primary Examiner* — Parviz Hassanzadeh
*Assistant Examiner* — Eric Weedon
(74) *Attorney, Agent, or Firm* — Haynes and Boone, LLP (57) ABSTRACT

The invention relates to a deposition device for comprising a processing space with a substrate support disposed therein, as well as several lift pins (50), which can be moved into and out of the plane of the substrate support to assist in introducing a semiconductor substrate into the processing space and removing it therefrom. The device is characterized in that the contact surface (52) of the lift pin (50) that is to be brought into contact with the semiconductor substrate and/or the substrate support is provided with a material layer (54) which has a lower hardness than the semiconductor substrate and/or the substrate support. This eliminates the risk of damage being caused to the substrate and/or to the substrate support as a result of said substrate shifting undesirably upon being lifted from and lowered onto the substrate support (susceptor). Thus there is no risk of scratches being formed and of particles being released, which might adversely affect the semiconductor manufacturing process.

11 Claims, 8 Drawing Sheets

DEVICE FOR LAYERED DEPOSITION OF VARIOUS MATERIALS ON A SEMICONDUCTOR SUBSTRATE, AS WELL AS A LIFT PIN FOR USE IN SUCH A DEVICE

The invention relates to a device for layered deposition of various materials on a semiconductor substrate, comprising a processing space with a substrate support disposed therein, on which the semiconductor substrate can be placed, means for supplying the various materials in gaseous form to the processing space, as well as several lift pins, which can be moved into and out of the plane of the substrate support to assist in introducing the semiconductor substrate into the processing space and removing it therefrom.

The invention also relates to a lift pin for use in such a device.

Such a device is for example shown in U.S. Pat. No. 6,596,086. Said U.S. patent shows a device as referred to in the introduction, which is provided with a susceptor, which functions to support a substrate. The substrate in question is subjected to a number of processing steps for forming semiconductor components on the substrate. The susceptor and the substrate or the wafer placed thereon are present in a so-called reactor chamber, through which process gases can be passed.

Once the process steps for forming the semiconductor components have been carried out, the substrate must be removed from the reactor chamber. To that end a number of support pins can be moved up from the susceptor, which pins thus raise the substrate placed thereon, so that the substrate will be lifted clear of the susceptor construction.

The raised substrate can thus be easily removed from the reactor chamber, on the one hand in order to be subjected to further processing steps and on the other hand in order to prepare the reactor chamber for receiving a new substrate. Such substrate lift pins are made of a material which is so hard that the pins cause scratches in the substrate. Such scratches, but also the particles that may be released as a result thereof, adversely affect the quality of the semiconductor manufacturing steps.

According to the invention, the device is to that end characterised in that the contact surface of the lift pin that is to be brought into contact with the semiconductor substrate and/or the substrate support is provided with a material layer which has a lower hardness than the semiconductor substrate and/or the substrate support. This eliminates the risk of damage being caused to the substrate and/or to the substrate support as a result of said substrate shifting undesirably upon being lifted from and lowered onto the substrate support (susceptor). Thus there is no risk of scratches being formed and of particles being released, which might adversely affect the semiconductor manufacturing process.

According to a special embodiment of the invention, the device is characterised in that the material layer consists of a carbon layer. More in particular, said material layer consists of a glassy carbon layer. This type of material has a hardness which is so low that the material will not damage the substrate surface or the substrate material (or the substrate support), whilst there will hardly be any release (if at all) of material particles from the lift pin.

According to a special embodiment of the invention, the material layer has a thickness of 1-300 µm, in particular a thickness of 20-30 µm.

According to said further special embodiment, the device according to the invention is characterised in that the lift pin is made of silicon carbide, whilst more in particular the lift pin is configured as an elongated, hollow element. It has furthermore been found that in a functional embodiment it is preferable if the wall thickness of the hollow lift pin is 50-1000 µm, in particular 100-500 µm, more in particular 200-300 µm. The use of a hollow lift pin has an advantageous effect on the thermal management within the reactor chamber, resulting in a reduced thermal mass and heat flow to and from the susceptor and the substrate during the semiconductor process steps.

A reduced heat flow between the substrate and the lift pin leads to a more uniform substrate temperature, thus eliminating or reducing the occurrence of quality differences in the substrate (surface) caused by local temperature differences near the lift pins. In deposition processes, temperature gradients may result in differences in layer thickness over the substrate surface, which risk is eliminated when using the above-described embodiment of the invention.

Another special embodiment of the invention is characterised in that the contact surface of the lift pin that is to be brought into contact with the semiconductor substrate is provided with one or more recessed portions. This, too, significantly reduces the contact area between the lift pin and the substrate placed thereon, so that the risk of damage and scratches and of any particles being released is significantly reduced as well.

The invention also relates to a lift pin as described in the present application.

The invention will now be explained in more detail with reference to the drawing, in which.

Figure 1A:
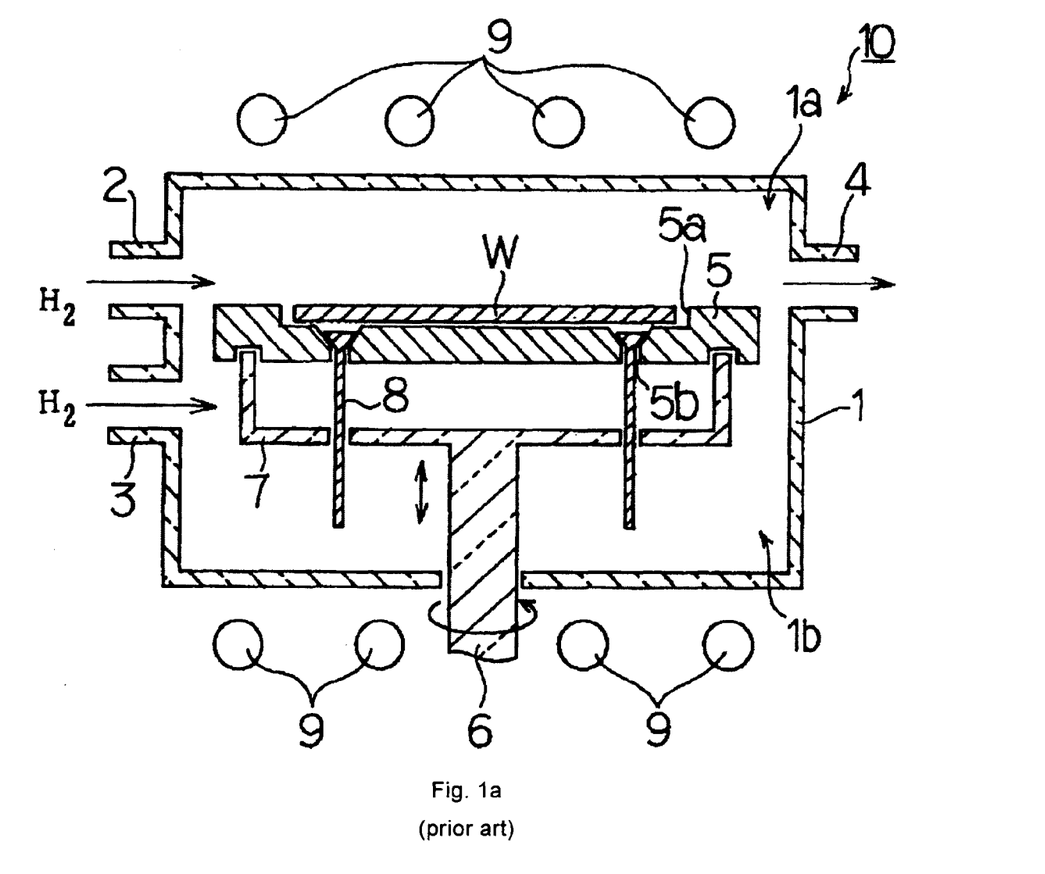
FIGS. 1a and 1b show an embodiment of a device according to the prior art.
Figure 1B:
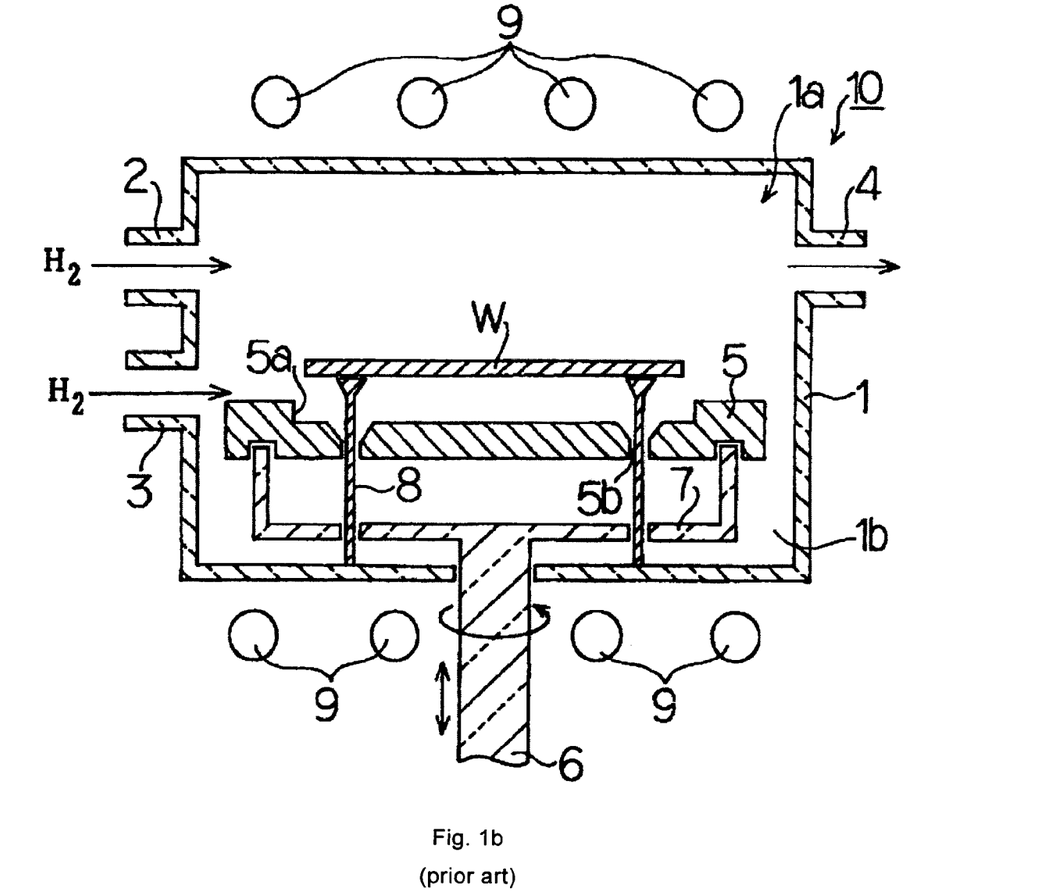

The embodiment shown in FIG. 1 of a device 10 according to the invention is suitable for treating one substrate at a time. A wafer is realised by depositing several semiconductor layers on the substrate W, from which wafer so-called semiconductor components can be obtained.

The device 10 is made up of a processing space or reactor chamber 1, which is made of transparent quartz and which is exposed to light from infrared light elements 9 from below and from above. The reactor chamber 1 is subdivided into an upper space 1a and a lower space 1b by means of a susceptor or substrate support 5. On said susceptor or substrate support 5, the substrate or wafer W is to be placed. The substrate support 5 is to that end provided with a recess 5a, in which the semiconductor substrate/wafer W can be received.

Via the inlets 2 and 3, various process gases can be introduced into the reactor chamber 1 for depositing several semiconductor layers onto the surface of the semiconductor substrate W. Said process gases can exit the reactor chamber 1 via the outlet 4. A more detailed explanation of said process steps is not considered necessary within the framework of the description of the invention, as they may be considered to form part of the general state of the art.

During the semiconductor manufacturing steps, the substrate support 5 can be rotated within the reactor chamber 1 by means of the support 7 and the support shaft 6, so that the process gases will wash over the entire area of the substrate W. During said rotation, said support shaft and said support 7 may be moved in vertical direction within the reactor chamber 1 together with the substrate support 5.

A number of openings 5b are present in the substrate support 5, which openings accommodate lift pins 8. By moving down the support shaft 6, the support 7 and the substrate support 5 at the end of the semiconductor manufacturing process steps, the semiconductor substrate W comes to be supported on the lift pins 8, so that the substrate W can be easily removed from the reactor chamber 1.

A drawback of the currently used lift pins is that they are made of a material having a hardness such that the pins may cause scratches in the surface of the substrate W. As a result of said scratching, material particles may be released. Such damage and loose particles may adversely affect the quality of the semiconductor manufacturing process.

Figure 2A:
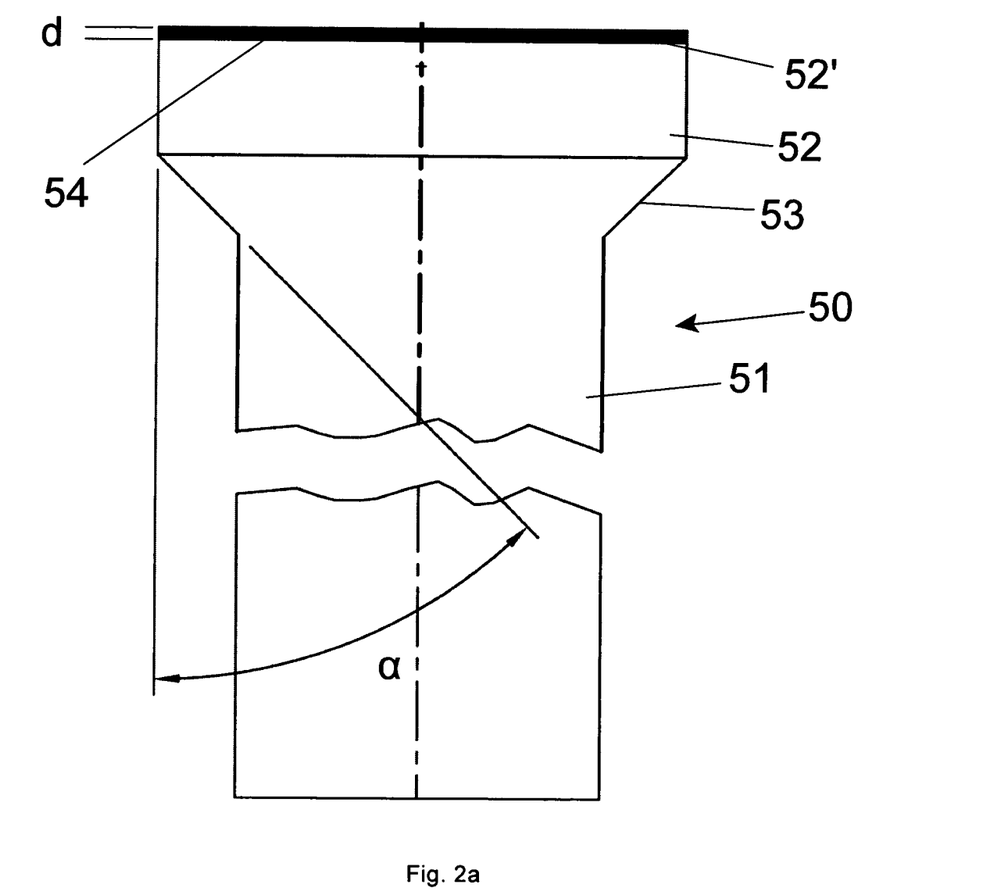
FIGS. 2a-2c show versions of a first embodiment of a lift pin according to the invention.
Figure 2B:
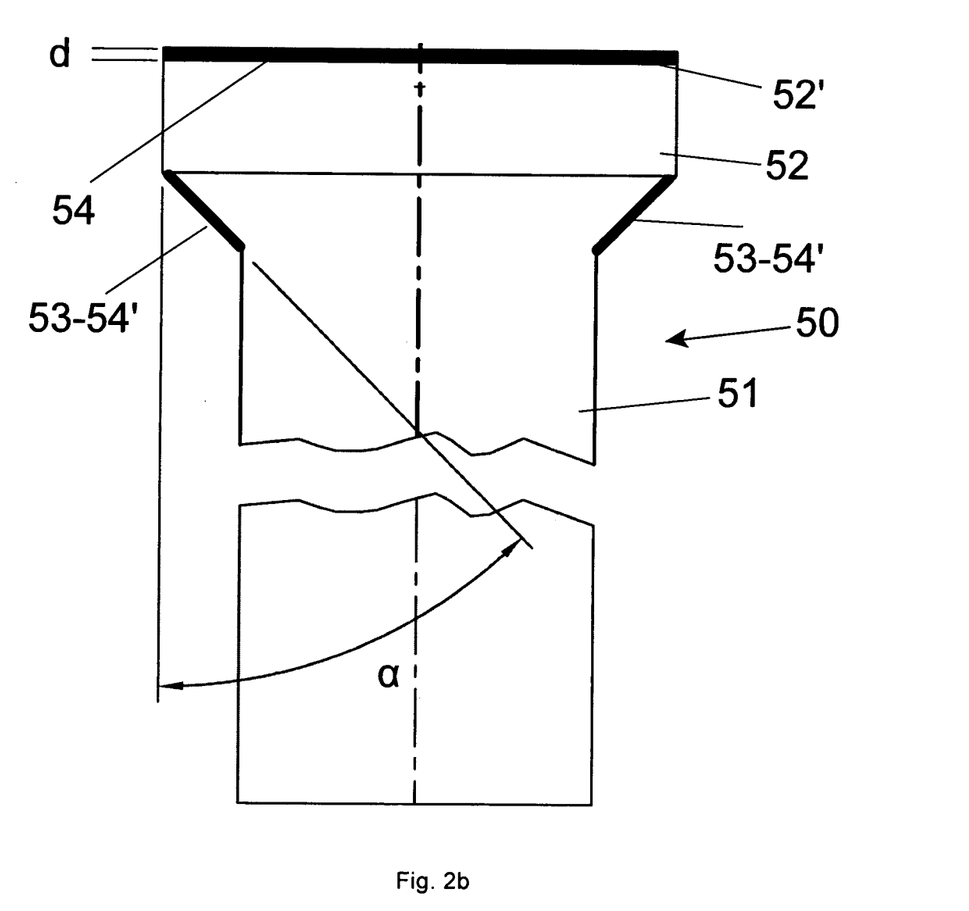
Figure 2C:
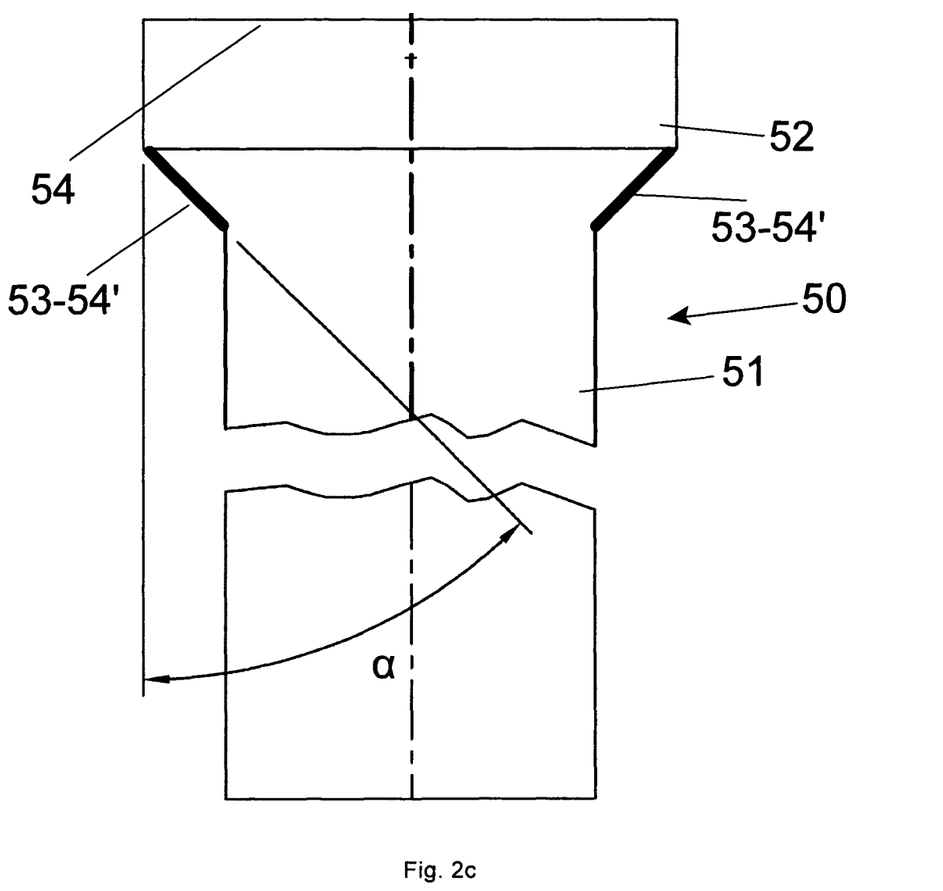

FIGS. 2a-2c show versions of a first embodiment of a lift pin according to the invention.

The lift pin according to the invention is indicated at 50 in said figures, and has an elongated shaft 51 which blends into a support surface 52 via a widened transition 53. According to the invention, the contact surface 52' on which the semiconductor substrate is supported is provided with a material layer 54, which has a lower hardness than the semiconductor substrate. More in particular, said material layer 54 consists of carbon, even more in particular of glassy carbon. Also other materials having a lower hardness than the semiconductor substrate may be used, however. The thickness D of the material layer 54 is 1-3000 µm, in particular 20-30 µm.

In FIG. 2a the contact surface 52' of the lift pin is provided with the material layer 54. In FIG. 2b also the transition 53 is provided with a material layer 54' according to the invention. The transition 53 forms the contact surface between the lift pin 50 and the substrate support, since the lift pin and the substrate support come into contact with each other during the upward and downward movement (as explained above in relation to FIGS. 1a and 1b) along said contact surface. By providing also said contact surface 53 with a material layer 54' having a lower hardness than the semiconductor substrate, an improved seal between the aforesaid contact surfaces is obtained. This leads to an improved gas seal, so that any exchange of gases is decreased or prevented and the semiconductor manufacturing process will not be adversely affected.

The lift pin 50 is made of silicon carbide or, more in particular, the lift pin is made of a material having a hardness comparable to the hardness of the material of which the substrate support is made.

FIG. 2c, to conclude, shows a lift pin 50 in which only the transition 53 is provided with a material layer 54' according to the invention.

Figure 3A:
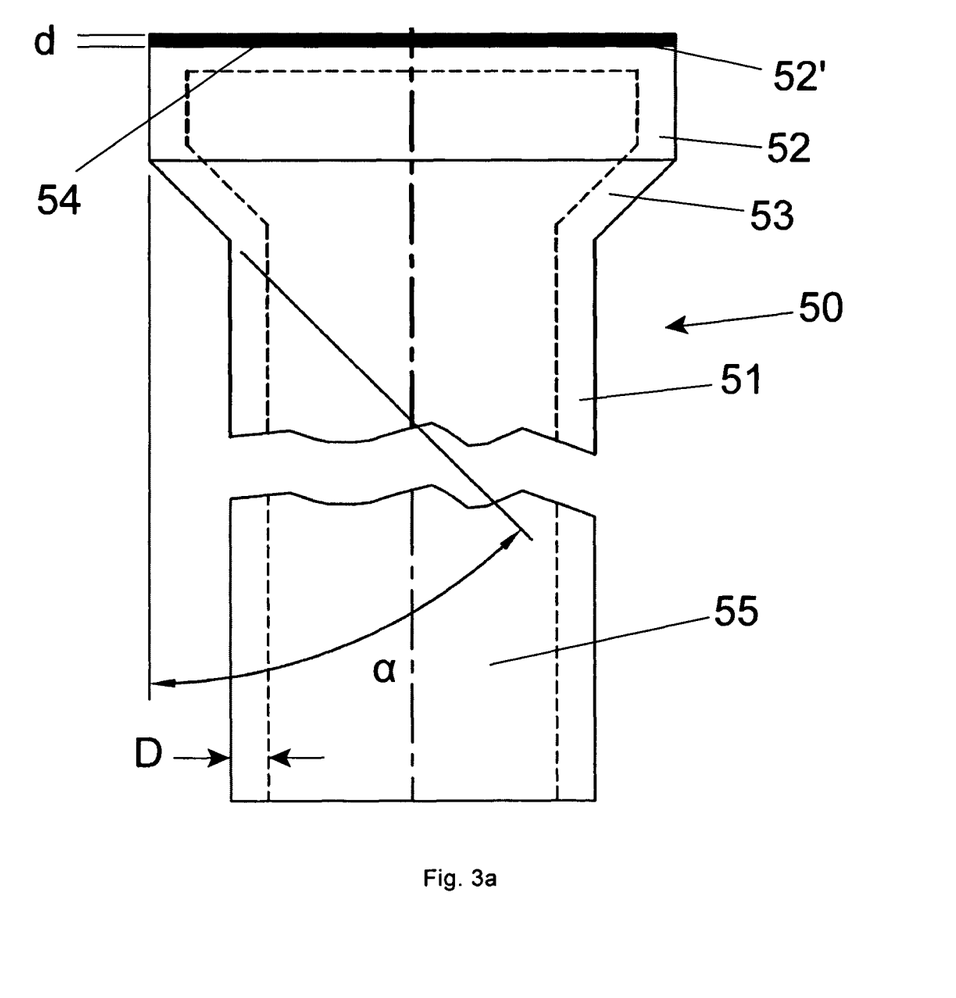
FIGS. 3a-3c show versions of a second embodiment of a lift pin according to the invention.
Figure 3B:
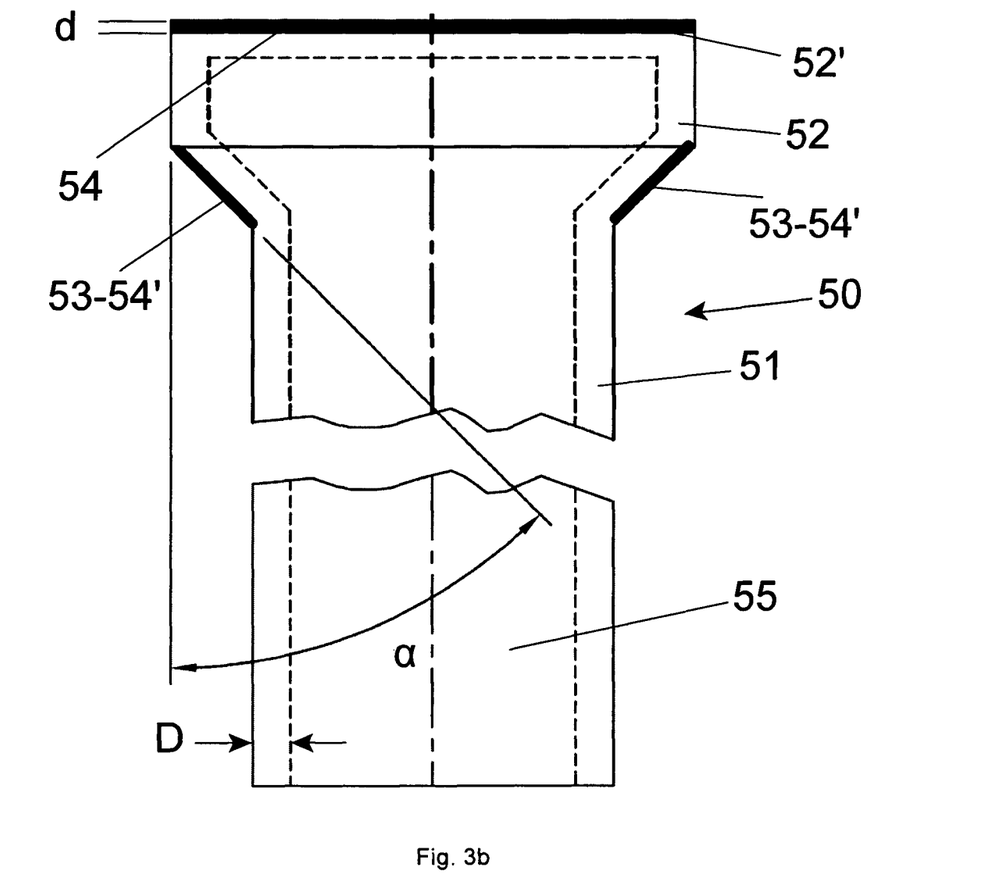
Figure 3C:
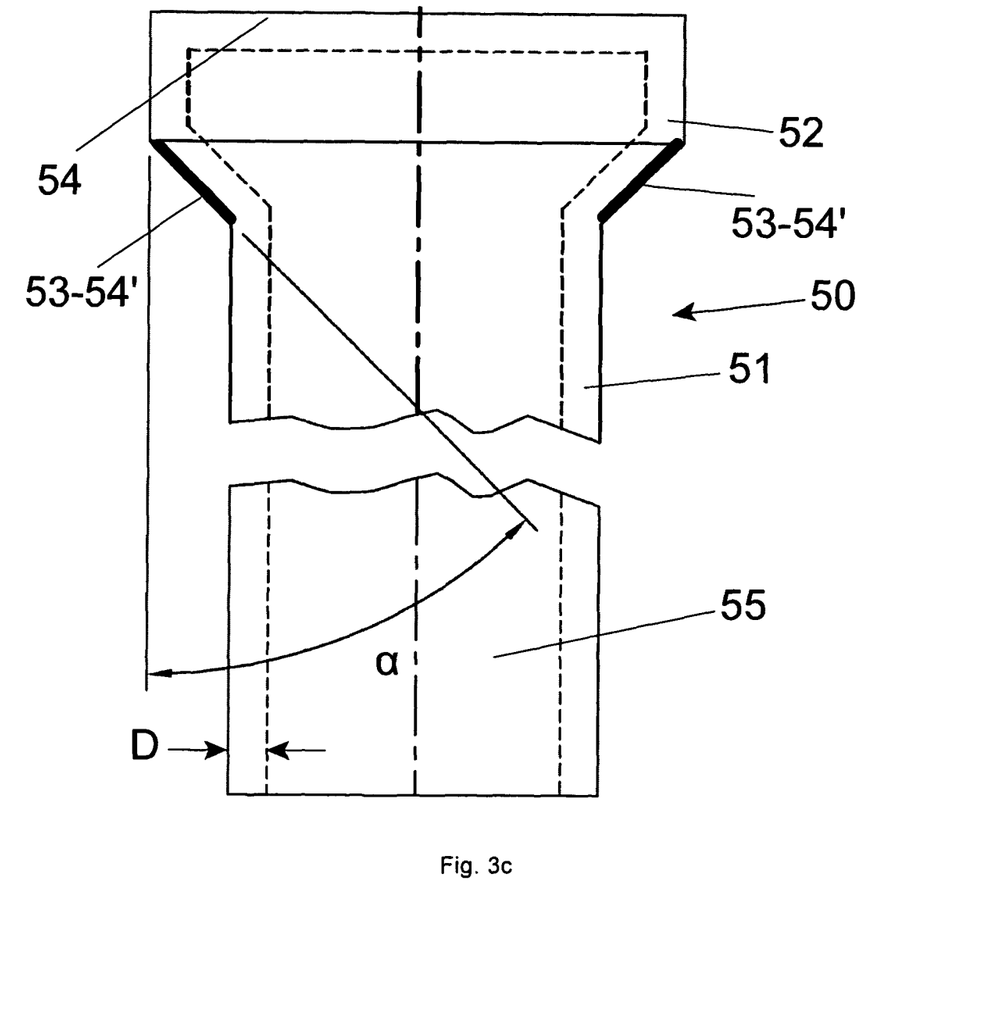

While FIGS. 2a-2c show a solid lift pin 50, the lift pin 50 as shown in corresponding versions in FIGS. 3a-3c is hollow, as it comprises a hollow space 55. The thickness D of the shaft of the lift pin 50 is 50-1000 µm, in particular 100-500 µm and more in particular 200-300 µm. In this way an improved thermal management can be realised, because the thermal mass and the heat flow from and to the semiconductor substrate supported on the lift pin can be reduced by using a hollow lift pin.

The more manageable and preferably reduced heat flow between the lift pin and the substrate will reduce the local temperature differences in the surface material of the substrate. A reduced heat flow between the substrate and the lift pin will lead to a more uniform substrate temperature, thus eliminating or reducing the occurrence of quality differences in the substrate (surface) caused by local temperature differences near the lift pins. In deposition processes, temperature gradients may lead to differences in layer thickness across the substrate surface, which is prevented by using the above-described embodiment of the invention.

It is further noted that, according to another aspect of the invention, the transition angle α between the shaft 51 and the transition 53 is preferably 30-80°.

The invention claimed is:

1. A device for layered deposition of various materials on a semiconductor substrate, comprising
    a processing space with a substrate support disposed therein, on which the semiconductor substrate can be placed,
    one or more inlets for supplying the various materials in gaseous form to the processing space, as well as
    a lift pin which can be moved into and out of the plane of the substrate support to assist in introducing the semiconductor substrate into the processing space and removing it therefrom, wherein the lift pin comprises a contact surface that is to be brought into contact with the semiconductor substrate and/or the substrate support, the contact surface being a surface of a glassy carbon layer, the lift pin also comprising silicon carbide underlying the glassy carbon layer, the glassy carbon layer being preventing the silicon carbide from contacting the semiconductor substrate and/or the substrate support;
    wherein the glassy carbon layer has a lower hardness than the substrate support.

2. A device according to claim 1, wherein the glassy carbon layer has a thickness of 1-300 µm.

3. A device according to claim 1, wherein the lift pin is configured as an elongated, hollow element.

4. A device according to claim 3, wherein the wall thickness of the hollow lift pin is 50-1000 µm.

5. A device according to claim 1, wherein the contact surface of the lift pin is to be brought into contact with the semiconductor substrate and is provided with one or more recessed portions.

6. A lift pin assembly provided in a processing space for processing a semiconductor substrate in a gaseous environment, comprising:
    a substrate support disposed in the processing space having a planar surface for supporting the semiconductor substrate;
    a plurality of lift pins each having a contact surface for contacting the semiconductor substrate or the substrate support, wherein the contact surface is a surface of a glassy carbon layer, each lift pin comprising silicon carbide underlying the glassy carbon layer, the glassy carbon layer being for preventing the silicon carbide from contacting the semiconductor substrate or the substrate support, the glassy carbon layer having a lower hardness than the substrate support; and
    mechanism for moving the lift pins into and out of the plane of the planar surface to assist in introducing the semiconductor substrate into the processing space and removing it therefrom.

7. A device according to claim 1, wherein the glassy carbon layer has a thickness of 20-30 µm.

8. A device according to claim 3, wherein the wall thickness of the hollow lift pin is 100-500 µm.

9. A device according to claim 3, wherein the wall thickness of the hollow lift pin is 200-300 µm.

10. A method for performing a layered deposition of one or more materials on a semiconductor substrate, the method comprising:
    placing the semiconductor substrate in a substrate support located, in a processing space,
    supplying the one or more materials in gaseous form to the processing space,
    moving a lift pin into and out of the plane of the substrate support to assist in introducing the semiconductor substrate into the processing space and removing it therefrom, wherein the lift pin comprises a contact surface that is brought into contact with the semiconductor substrate and/or the substrate support, the contact surface being a surface of a glassy carbon layer, the lift pin also comprising silicon carbide underlying the glassy carbon layer, the glassy carbon layer being for preventing the silicon carbide from contacting the semiconductor substrate and/or the substrate support;

wherein the glassy carbon layer has a lower hardness than, respectively, the semiconductor substrate and/or the substrate support.

11. A method according to claim 10 wherein the lift pin is configured as an elongated, hollow element.

* * * * *